United States Patent [19]

Loebach

[11] 4,215,935
[45] Aug. 5, 1980

[54] METHOD AND DEVICE FOR THE PROJECTION PRINTING OF A MASK ONTO A SEMICONDUCTOR SUBSTRATE

[76] Inventor: Ernst W. Loebach, Tonagass 374, FL-949 L Eschen, Liechtenstein

[21] Appl. No.: 42,031

[22] Filed: May 24, 1979

[51] Int. Cl.² .................... G03B 27/54 G03B/27/32
[52] U.S. Cl. .................................... 355/67; 355/77
[58] Field of Search .......................... 355/67–71, 355/77, 125, 3 R

[56] References Cited

U.S. PATENT DOCUMENTS

| 3,334,543 | 8/1967 | Perner et al. | 355/67 X |
| 3,573,456 | 4/1971 | Beeh | 355/71 X |
| 3,729,257 | 4/1973 | Gunto et al. | 355/67 |
| 4,083,634 | 4/1978 | Momose et al. | 355/71 |

Primary Examiner—Donald A. Griffin
Attorney, Agent, or Firm—Haseltine, Lake & Waters

[57] ABSTRACT

A method and device for the projection printing of a mask onto a workpiece, particularly onto a semiconductor substrate, said mask being illuminated by means of a light source and imaged on said workpiece by means of a projection lens, said workpiece being coated with a photoresist.

4 Claims, 5 Drawing Figures

WAVELENGTH - NANOMETERS

ULTRAVIOLET ABSORPTION OF RESISTS VS. SPECTRAL EMISSION OF LIGHT SOURCE

METHOD AND DEVICE FOR THE PROJECTION PRINTING OF A MASK ONTO A SEMICONDUCTOR SUBSTRATE

BACKGROUND OF THE INVENTION

1. Field of the Invention

The present invention relates to a method and device for the projection printing of a mask onto a workpiece, particularly onto a semiconductor substrate being coated with a photoresist.

2. Description of the Prior Art

In the production of intigrated circuits masks having different circuit patterns are imaged on the photoresist of a semiconductor substrate. After development, the photoresist serves for covering the substrate at desired points during subsequent processing cycles, e.g. etching- and diffusing processes. As very high demands to accuracy are made in the manufacture of integrated circuits, e.g. line widths in the range of 1 $\mu$m have to be imaged, projection lenses having a reduction factor of 10, for example, are used for imaging the mask pattern onto the substrate. Due to various marginal conditions, such as the size of the image field and the available types of glass, lens systems being transparent to wavelengths >400 nm are used for the projection lens. Moreover, the lens has to be color-corrected in order to avoid errors due to chromatic aberration. Said color correction can only be made in the case of band widths of about 6 nm.

The spectral sensitivity of the employed photoresists is the determining factor for the choice of suitable light sources. The most frequently used photoresists fulfilling the requirements in respect of adhesion, workability, resolution and etching resistance contain diazo compounds as photosensitve components. The spectral sensitivity of photoresists reaches a maximum in the range of wavelengths of about 400 nm and drops rapidly in the range to about 450 nm.

A mercury vapor lamp is mostly used as light source emitting spectral lines having wave lengths of 405 nm and 436 nm. The spectral line at 436 nm has most frequently been used up to the present for exposing the photoresist, as said line is of higher intensity. The color correction of the objective lens has been made accordingly. It is, however, of disadvantage that the absorption curve of photoresists drops in the range of 436 nm. Consequently, a slight displacement of said absorption curve, which could occur during the manufacture and application of the photoresist, causes considerable changes of the correct exposure time. Changes of only a few percents have already adverse effects. Moreover, the resolution at an exposure wave length of 436 nm is worse compared with wave length of 400 nm, which can still be transmitted by projection lenses.

SUMMARY OF THE INVENTION

It is, therefore, the object of the present invention to provide a projection printing method achieving optimum image quality and simultaneously keeping exposure time as short as possible and obtaining constant energy absorption of the photoresist.

According to the invention this is achieved by using a gallium-doped mercury vapor lamp as light source.

As known in the art, a mercury vapor lamp doped with gallium iodide emits wider spectral lines resp. bands in comparison with pure mercury vapor lamps. The spectral range used for exposing the photoresist lies between 402 and 408 nm, thereby obtaining substantially greater intensity. Absorption curve maxima of commonly used photoresists lie within said range, and maximum resolution is obtained. Furthermore, the life time of mercury vapor lamps doped with gallium iodide is substantially longer.

Within the scope of the present invention it is also possible to dope the mercury discharge lamp with indium. The emission band to be chosen for exposure, then lies in the range of 412 nm, is, however, of less intensity as compared with the gallium-doped mercury lamp.

DESCRIPTION OF THE PREFERRED EMBODIMENT

Figure 1:
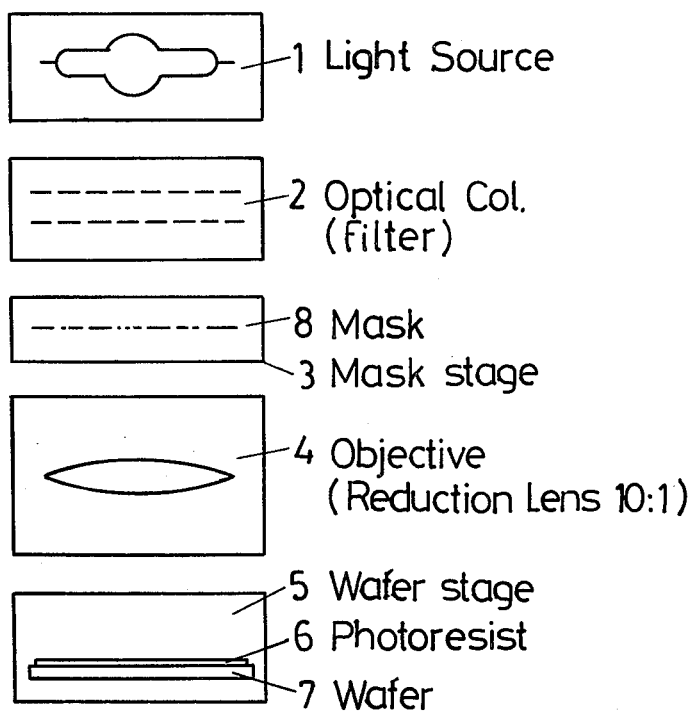
FIG. 1 shows the essential structural assemblies of the optical chain of a device for the projection printing of masks onto a semiconductor substrate.

As shown in FIG. 1, a device for the projection printing of masks onto a semiconductor substrate comprises a mask stage 3 and a stage 5 for the work piece. A projection lens 4 is disposed between the mask stage 3 and the stage 5 for the substrate, said projection lens having a reduction ratio of 10:1. The mask 8 and the substrate 7 can be brought into alignment by moving the stages 3 and 5. The surface of the substrate 7 is coated with a photoresist 6, said resist being positive or negative. The most commonly used photoresists usually contain diazo compounds as a photosensitive component. The chemical processes in the photoresists as well as their application onto the substrate 7 are, for example, described in detail in the publications "Solid State Technology", August 1978, and IBM J. RES. DEVELOP., VOL. 23, No. 1, January 1979.

A light source 1 is provided for illuminating the mask an optical structural assembly 2 with spectral filters and other members being connected thereto.

Figure 2A:
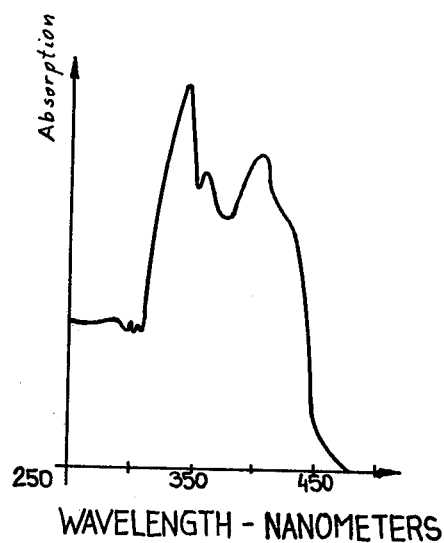
FIGS. 2a and 2b show the energy absorption curves of two commonly used photoresists.
Figure 2B:
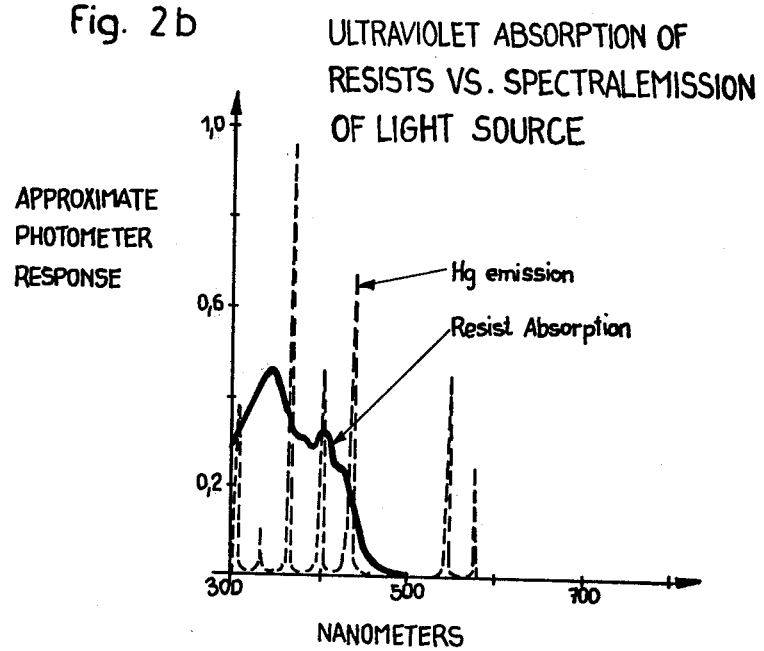

FIGS. 2a and 2b show absorption spectra of two commercially available photoresists provided for the manufacture of integrated circuits. They have substantially the same characteristics, as sensitivity reaches a maximum in the range of 400 nm, whereas sensitivity rapidly decreases in the range to 450 nm. Due to the above-mentioned reasons, it has been necessary up to the present, to expose the photoresist with a wave length exceeding 400 nm. This is due to the fact that the types of glass used for the projection lens are highly absorbent below 400 nm.

Figure 3:
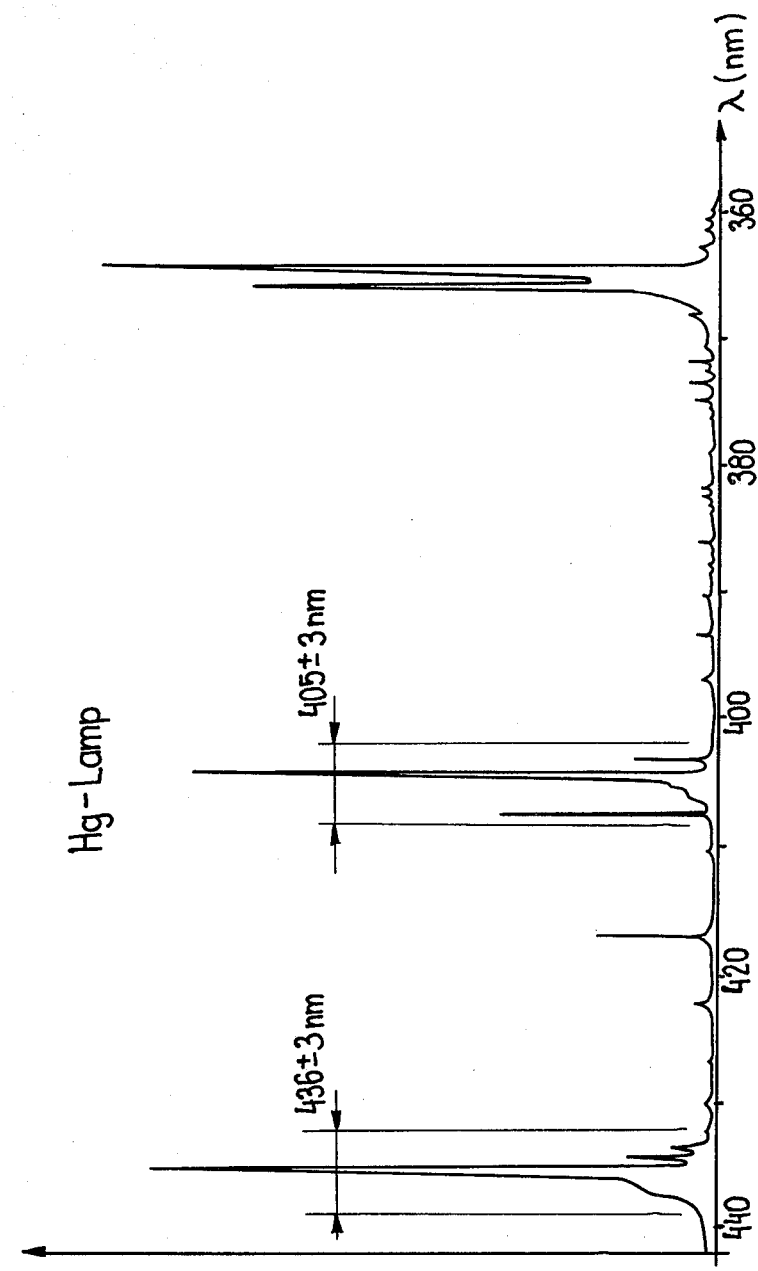
FIG. 3 shows the emission spectrum of a mercury vapor lamp.

Up to the present mercury high pressure lamps have most frequently been used as light source for the exposure of the photoresist. The emission spectrum of such a mercury high pressure lamp is illustrated in FIG. 3. It has two relatively narrow spectral lines in the range of >400 nm, one of said lines lying at about 405 nm and the other one at about 436 nm. It will become obvious from said figure, that the intensity of the spectral line is substantially higher at 436 nm. For this reason the objection lens is frequently color-corrected for the range of 436±3 nm, and the photoresist is exposed accordingly. As can be seen in FIGS. 2a and 2b, the absorption curve of the photoresist drops in the wave length range of 436 nm, so that slight changes in the conditions during the resist preparation may cause considerable changes of the correct exposure time.

A change to the spectral line at 405 nm would again create the adverse effect of the obviously low intensity of the spectral line of the mercury lamp.

Figure 4:
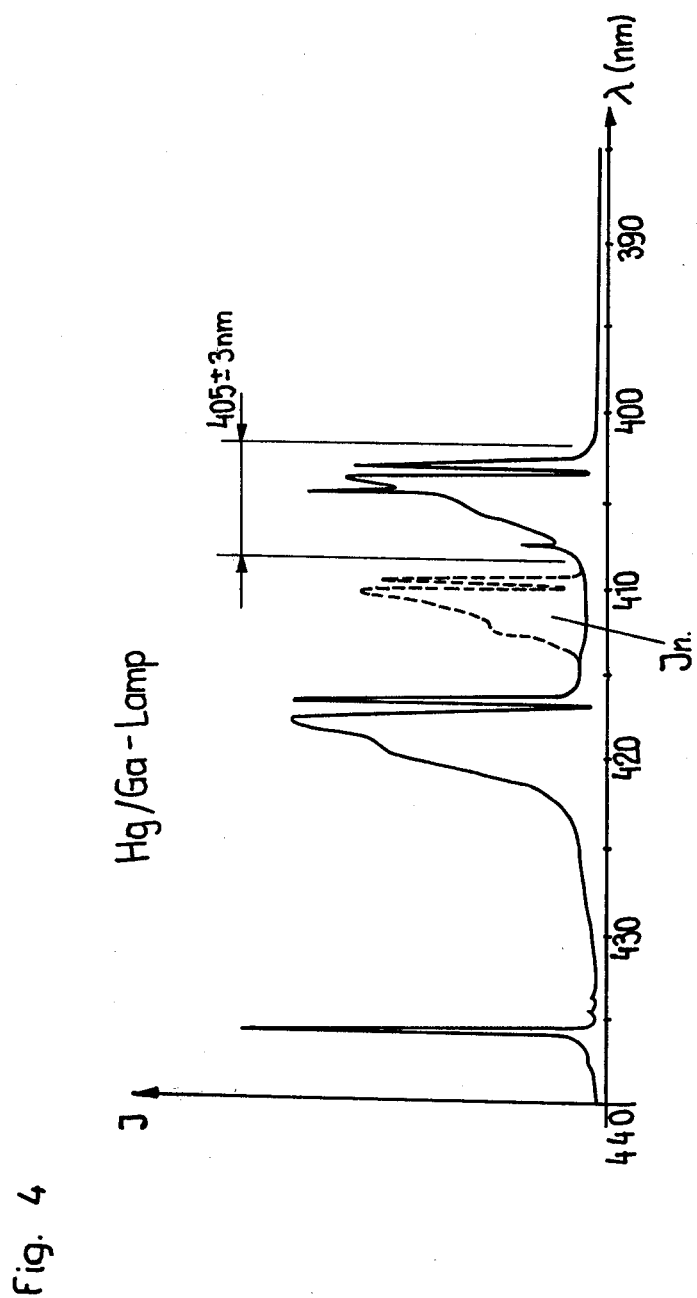
FIG. 4 shows the emission spectrum of a gallium-doped mercury vapor lamp.

According to the invention a gallium-doped mercury lamp is used as light source. FIG. 4 shows the emission spectrum of such a lamp. It will become obvious again, that the intensity of the emitted radiation is substantially higher in the range of between 402 and 408 nm. Accordingly, the projection lens is color-corrected for this spectral range, whereas the residual spectral components are removed by means of filters. The gallium-doped mercury vapor lamp used in accordance with the present invention yields optimum results in respect of optical resolution and the sensitivity of the photoresist. Slight displacements of the absorption spectrum of the photoresist, which are due to its manufacture and application, cause no substantial changes in the radiation energy absorbed by the photoresist.

In the present embodiment the intensity integral of the gallium-iodide lamp used in accordance with the present invention is in the wave length range of between 402 and 408 nm about three to five times greater than the intensity integral of a conventional mercury lamp. Consequently, the required exposure times are reduced to between ⅓ and 1/5 of the exposure times required up to the present.

An indium-doped mercury vapor lamp can be used instead of the gallium-doped mercury lamp. The emission band to be chosen in the latter case is shown by a dotted line in FIG. 4. Its intensity is slightly lower, however, and its resolution lies slightly below that of gallium-doped mercury vapor lamps.

What is claimed is:

1. A method for the projection printing of a mask onto a workpiece, particularly onto a semiconductor substrate, said mask being illuminated by means of a light source and imaged on said workpiece by means of a projection lens, said workpiece being coated with a photoresist, wherein a gallium-doped mercury vapor lamp is used as said light source.

2. A method for the projection printing of a mask onto a workpiece, particularly onto a semiconductor substrate, said mask being illuminated by means of a light source and imaged on said workpiece by means of a projection lens, said workpiece being coated with a photoresist, wherein an indium-doped mercury vapor lamp is used as said light source.

3. A device for the projection printing of a mask onto a workpiece, particularly onto a semiconductor substrate, comprising a light source and a projection lens, said mask being arranged in the object plane of said projection lens and said workpiece being arranged in the image plane, said workpiece being coated with a photoresist, wherein said light source is a gallium-doped mercury vapor lamp and said projection lens is color-corrected in a spectral range of between 402 and 408 nm.

4. A device for the projection printing of a mask onto a workpiece, particularly onto a semiconductor substrate, comprising a light source and a projection lens, said mask being arranged in the object plane of said projection lens and said workpiece being arranged in the image plane, said workpiece being coated with a photoresist, wherein said light source is an indium-doped mercury vapor lamp and said projection lens is color-corrected in a spectral range of between 412 and 418 nm.

* * * * *

UNITED STATES PATENT AND TRADEMARK OFFICE
CERTIFICATE OF CORRECTION

PATENT NO. : 4,215,935

DATED : AUGUST 5, 1980

INVENTOR(S) : LOEBACH

It is certified that error appears in the above-identified patent and that said Letters Patent are hereby corrected as shown below:

On the first page of the patent, beneath the inventor's name and address insert- ---Assignee: CENSOR PATENT - UND VERSUCHS-ANSTALT; LIECHTENSTEIN. --

Signed and Sealed this

Third Day of March 1981

[SEAL]

Attest:

RENE D. TEGTMEYER

Attesting Officer     Acting Commissioner of Patents and Trademarks

Dedication 4,215,935.—*Ernst W. Loebach*, Eschen, Liechtenstein. METHOD AND DEVICE FOR THE PROJECTION PRINTING OF A MASK ONTO A SEMICONDUCTOR SUBSTRATE. Patent dated Aug. 5, 1980. Dedication filed Feb. 20, 1990, by the assignee, Mercotrust Aktiengesellschaft.

Hereby dedicates to the Public the remaining term of said patent.
[ *Official Gazette August 7, 1990* ]